United States Patent
Maloney et al.

(10) Patent No.: US 7,579,087 B2
(45) Date of Patent: Aug. 25, 2009

(54) THERMAL BARRIER COATING COMPOSITIONS, PROCESSES FOR APPLYING SAME AND ARTICLES COATED WITH SAME

(75) Inventors: Michael J. Maloney, Marlborough, CT (US); David A. Litton, Rocky Hill, CT (US); Kevin W. Schlichting, Storrs, CT (US); Melvin Freling, West Hartford, CT (US); John G. Smeggil, Simsbury, CT (US); David B. Snow, Glastonbury, CT (US)

(73) Assignee: United Technologies Corporation, Hartford, CT (US)

( * ) Notice: Subject to any disclaimer, the term of this patent is extended or adjusted under 35 U.S.C. 154(b) by 39 days.

(21) Appl. No.: 11/328,894

(22) Filed: Jan. 10, 2006

(65) Prior Publication Data

US 2008/0113217 A1    May 15, 2008

(51) Int. Cl.
*B32B 9/00* (2006.01)
(52) U.S. Cl. .................. 428/469; 428/472; 428/701; 428/702; 416/241 B
(58) Field of Classification Search .............. None
See application file for complete search history.

(56) References Cited

U.S. PATENT DOCUMENTS

| | | | |
|---|---|---|---|
| 3,528,861 A | 9/1970 | Elam et al. | |
| 3,542,530 A | 11/1970 | Talboom, Jr. et al. | |
| 3,649,225 A | 3/1972 | Simmons, Jr. | |
| 3,676,085 A | 7/1972 | Evans et al. | |
| 3,754,903 A | 8/1973 | Goward et al. | |
| 4,078,922 A | 3/1978 | Magyar et al. | |
| 4,585,481 A | 4/1986 | Gupta et al. | |
| 5,516,595 A | 5/1996 | Newkirk et al. | |
| 5,906,895 A | 5/1999 | Hamada et al. | |
| 6,730,413 B2 * | 5/2004 | Schaeffer et al. | ............. 428/632 |
| 6,770,325 B2 | 8/2004 | Troczynski et al. | |
| 7,070,853 B2 * | 7/2006 | Paul | ........................ 428/304.4 |
| 2007/0160859 A1 | 7/2007 | Darolia et al. | |

FOREIGN PATENT DOCUMENTS

| | | |
|---|---|---|
| CN | 87106237 A | 7/1988 |
| CN | 1178204 A | 4/1998 |

OTHER PUBLICATIONS

European Search Report, May 4, 2007.
Translation of Chinese Office Action for CN200710002249.6, dated Dec. 26, 2008.

* cited by examiner

*Primary Examiner*—Timothy M Speer
(74) *Attorney, Agent, or Firm*—Bachman & LaPointe, P.C.

(57) ABSTRACT

A process of coating an article includes the steps of (1) forming a layer of a ceramic based compound on an article; (2) providing a solution containing a metal as a particulate having a diameter of about 10 nanometers to about 1000 nanometers and present in an amount of about 25 percent to about 50 percent by volume of the solution; (3) contacting the ceramic based compound layer with the solution; (4) drying the article; and (5) optionally repeating steps (3) and (4).

23 Claims, 6 Drawing Sheets

THERMAL BARRIER COATING COMPOSITIONS, PROCESSES FOR APPLYING SAME AND ARTICLES COATED WITH SAME

BACKGROUND OF THE INVENTION

The invention relates to thermal barrier coating compositions, processes for applying same and articles coated with same. More particularly, the invention relates to thermal barrier coating compositions designed to withstand molten sand infiltration, processes for applying same and articles coated with same.

The degradation of turbomachinery parts due to sand related distress of thermal barrier coatings ("TBCs") is a concern with respect to all turbomachinery in use in the Middle East. Sand related distress is responsible for the premature spallation of TBCs and oxidation of turbomachinery and their parts. The mechanism of such sand related distress is the penetration of the TBCs by molten sand. During its useful life, sand may enter the turbomachinery, agglomerate and become molten upon the TBC surface. The molten sand penetrates the TBC and reaches the ceramic/metallic interface. The failure of the TBC occurs by a combination of molten sand attacking the thermally grown oxide at the ceramic/metallic interface as well as the reduction in strain tolerance, of the fully infiltrated TBC, to thermal cycling. Failure of the TBC occurs by spallation which exposes the part's surface to the elements, thus causing the accelerated oxidation of the turbomachinery part inconjunction with molten sand attack.

Consequently, there exists a need for a thermal barrier coating designed to resist sand related distress.

SUMMARY OF THE INVENTION

In accordance with the present invention, a process of coating an article broadly comprises (1) forming a layer of a ceramic based compound on an article; (2) providing a solution broadly comprising a metal particulate broadly comprising a diameter of about 10 nanometers to about 1000 nanometers and present in an amount of about 25 percent to about 50 percent by volume of the solution (3) contacting the ceramic based compound layer with the solution; and (4) drying the article.

In accordance with the present invention, a thermal barrier coating broadly comprising a ceramic based compound; a metal oxide; and a metal broadly comprising a diameter of about 10 nanometers to about 1000 nanometers and present in an amount of at least about 25 percent by weight of the ceramic based compound, wherein the thermal barrier coating broadly comprises a porosity of no more than about 30 percent by volume of the ceramic based compound.

In accordance with the present invention, a coated article broadly comprising an article comprising at least one surface comprising a thermal barrier coating disposed thereupon, wherein the thermal barrier coating broadly comprises a ceramic based compound; a metal oxide; and a metal in an amount of at least about 25 percent by weight of the ceramic based compound, wherein the thermal barrier coating broadly comprises a porosity of no more than about 30 percent by volume of the thermal barrier coating.

In accordance with the present invention, a coating broadly comprising a reaction product of at least one silicate and a thermal barrier coating composition, wherein the thermal barrier coating composition broadly comprises a ceramic based compound; a metal oxide; and a metal in an amount of at least about 25 percent by weight of the ceramic based compound, wherein the thermal barrier coating comprises a porosity of no more than about 30 percent by volume of said thermal barrier coating composition.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 2 is a flowchart representing another process of the present invention of FIG. 1a;

Like reference numbers and designations in the various drawings indicate like elements.

DETAILED DESCRIPTION

The thermal barrier coating of the present invention is designed to react with molten sand to form a sealant layer comprising the reaction product within the thermal barrier coating. Sand generally comprises at least calcium magnesia alumina silicate (hereinafter referred to as "CMAS"), including other components such sodium, iron, potassium and the like, depending upon the geographical and geological conditions of the sand.

As used herein, the term "solution" means a solvent and at least one solute that form a solution, a suspension, or other variation suitable for use in the present method(s), composition(s), coating(s), and coated article(s). As used herein, the term "metal" means a metal originally present as a metal of an oxide or as a metal of a salt.

Figure 1:
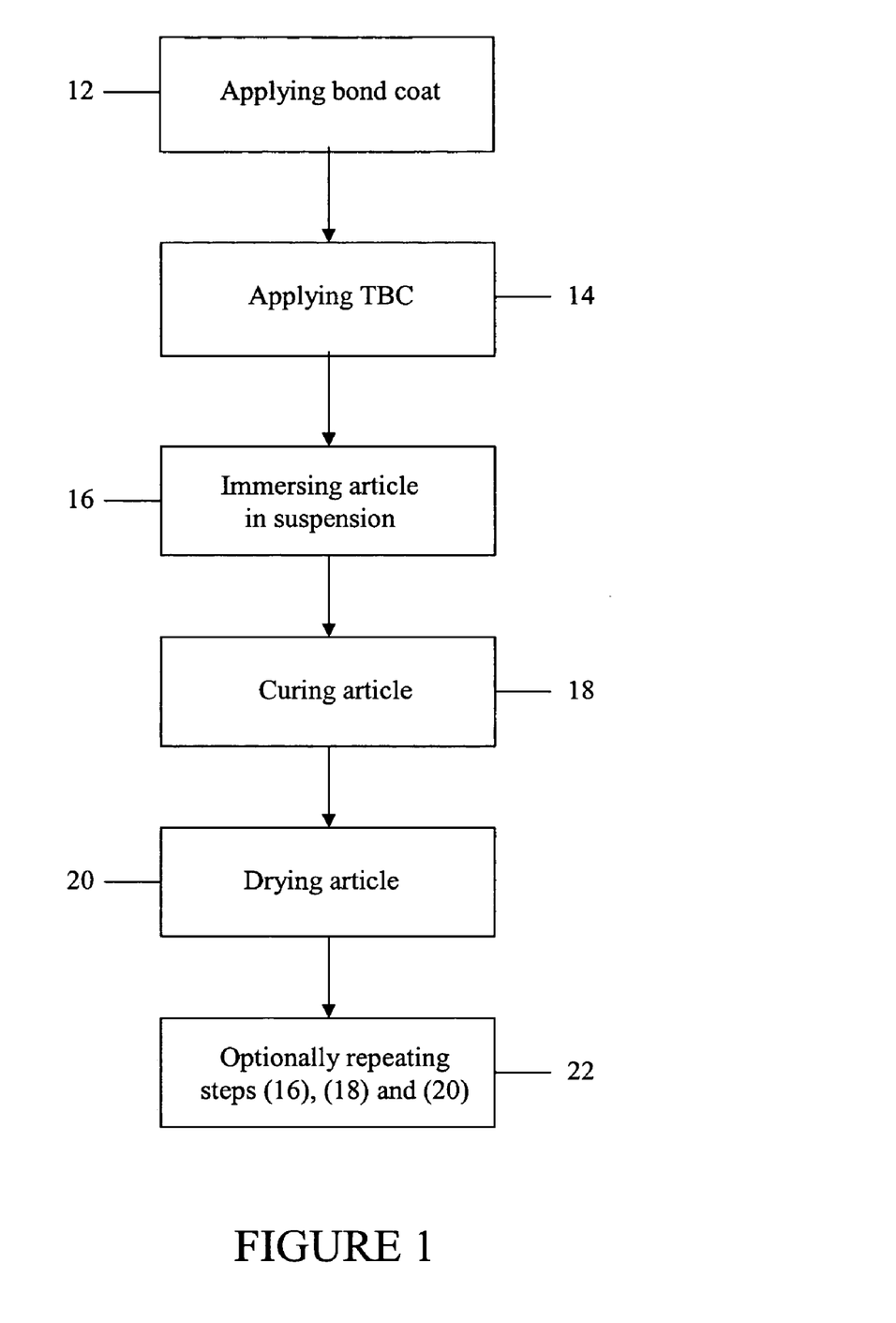
FIG. 1 is a flowchart representing one process of the present invention.

Referring now to FIG. 1, a flowchart representing one of the processes of the present invention is shown. An article may be provided and may optionally be coated with a bond coat material at a box 12. The bond coat material may comprise a formula MCrAlY. MCrAlY refers to known metal coating systems in which M denotes nickel, cobalt, iron, platinum or mixtures thereof; Cr denotes chromium; Al denotes aluminum; and Y denotes yttrium. MCrAlY materials are often known as overlay coatings because they are applied in a predetermined composition and do not interact significantly with the substrate during the deposition process. For some non-limiting examples of MCrAlY materials see U.S. Pat. No. 3,528,861 which describes a FeCrAlY coating as does U.S. Pat. No. 3,542,530. In addition, U.S. Pat. No. 3,649,225 describes a composite coating in which a layer of chromium is applied to a substrate prior to the deposition of a MCrAlY coating. U.S. Pat. No. 3,676,085 describes a CoCrAlY overlay coating while U.S. Pat. No. 3,754,903 describes a NiCoCrAlY overlay coating having particularly high ductility. U.S. Pat. No. 4,078,922 describes a cobalt base structural alloy which derives improved oxidation resistance by virtue of the presence of a combination of hafnium and yttrium. A preferred MCrAlY bond coat composition is described in U.S. Pat. No. Re. 32,121, which is assigned to the present Assignee and incorporated herein by reference, as having a weight percent compositional range of 5-40 Cr, 8-35 Al, 0.1-2.0 Y, 0.1-7 Si, 0.1-2.0 Hf, balance selected from the group consisting of Ni, Co and mixtures thereof. See also U.S. Pat. No. 4,585,481, which is also assigned to the present Assignee and incorporated herein by reference.

The bond coat material may also comprise Al, PtAl and the like, that are often known in the art as diffusion coatings. In addition, the bond coat material may also comprise Al, PtAl, MCrAlY as described above, and the like, that are often known in the art as cathodic arc coatings.

These bond coat materials may be applied by any method capable of producing a dense, uniform, adherent coating of the desired composition, such as, but not limited to, an overlay bond coat, diffusion bond coat, cathodic arc bond coat, etc. Such techniques may include, but are not limited to, diffusion processes (e.g., inward, outward, etc.), low pressure plasma-spray, air plasma-spray, sputtering, cathodic arc, electron beam physical vapor deposition, high velocity plasma spray techniques (e.g., HVOF, HVAF), combustion processes, wire spray techniques, laser beam cladding, electron beam cladding, etc.

The particle size for the bond coat 30 may be of any suitable size, and in embodiments may be between about 15 microns (0.015 mm) and about 60 microns (0.060 mm) with a mean particle size of about 25 microns (0.025 mm). The bond coat 30 may be applied to any suitable thickness, and in embodiments may be about 5 mils (0.127 mm) to about 10 mils (0.254 mm) thick. In some embodiments, the thickness may be about 6 mils (0.152 mm) to about 7 mils (0.178 mm) thick.

After applying an optional bond coat layer to the article, the article may be coated with a thermal barrier compound to form a thermal barrier coating (hereinafter "TBC") at a step 14 of FIG. 1. The article may comprise any part that is typically coated with a thermal barrier compound and, in particular, may comprise a part used in turbomachinery applications such as, but not limited to, any part having an airfoil, any part having a seal, airfoils, seals, and the like. The thermal barrier compound may comprise a ceramic based compound for use with turbomachinery applications as known to one of ordinary skill in the art. Representative thermal barrier compounds include, but are not limited to, any stabilized zirconate, any stabilized hafnate, combinations comprising at least one of the foregoing compounds, and the like, for example, yttria stabilized zirconia, calcia stabilized zirconia, magnesia stabilized zirconia, yttria stabilized hafnia, calcia stabilized hafnia and magnesia stabilized hafnia. Yttria stabilized zirconia is commercially available as 7YSZ®.

The thermal barrier compound may be applied to the article using any number of processes known to one of ordinary skill in the art. Suitable application processes include, but are not limited to, physical vapor deposition (e.g., electron beam), thermal spray (e.g., air plasma, high velocity oxygen fuel), sputtering, sol gel, slurry, combinations comprising at least one of the foregoing application processes, and the like. As recognized by one of ordinary skill in the art, a thermal barrier coating applied via an electron beam physical vapor deposition process forms an intercolumnar microstructure exhibiting free standing columns with interstices, that is, pores, voids, and the like, formed between the columns. Also as recognized by one of ordinary skill in the art, a thermal barrier coating applied via a thermal spray process exhibits a tortuous, interconnected porosity due to the splats and microcracks formed via the thermal spray process.

Once the TBC is applied, the article may be immersed within a solution comprising a suspension as shown at a box 16 of FIG. 1. The suspension may comprise a solvent, a metal originally present as an oxide of a metal, and at least one ultra-violet curable resin, at least one dispersant and in the alternative, or in addition to, at least one surfactant. When the TBC comprises columnar structures with interstices, the article may be dipped or immersed within the suspension at about 68° F. (20° C.) to about 150° F. (66° C.) and initially under a vacuum of about 10 torr (0.19 psi) to about 100 torr (1.9 psi) for about 2 minutes to about 5 minutes at which point the pressure may then be adjusted to atmospheric pressure, that is, about 760 torr (14.7 psi). When the TBC comprises a tortuous, interconnected porosity, the article may be dipped or immersed within the suspension at about 68° F. (20° C.) to about 150° F. (66° C.) and initially under a vacuum of about 10 torr (0.19 psi) to about 100 torr (1.9 psi) for about 2 to about 10 minutes at which point the pressure may then be adjusted to atmospheric pressure. One of ordinary skill in the art will recognize this process is also known as vacuum impregnation. The goal is to draw out the air present in the interstices or porosity of the TBC in order to make room for the metal to enter. To further draw out the air the article may be agitated, for example, moved within the suspension, to force out any air remaining.

After immersing the TBC coated article, the coated article may be treated with ultra-violet light energy at a box 18 of FIG. 1 to cure the ultra-violet curable resin present in the metal containing TBC. The coated article may be treated with ultra-violet light energy for about 10 second to about 60 seconds using processes known to one of ordinary skill in the art. In the alternative, when utilizing a heat curable resin, the coated article may be treated at a temperature of about 300° F. for about 20 minutes to about 60 minutes in an oven, or similar suitable apparatus, as known to one of ordinary skill in the art.

After curing the TBC coated article, the article may be dried to remove, that is, evaporate or burn off, the excess solvent, dispersant and/or resin materials at a box 20 of FIG. 1. The article may be dried using any processes known to one of ordinary skill in the art suitable for use herein. Suitable drying processes include, but are not limited to, air drying, drying under pressure, drying under a heating element, combinations comprising at least one of the foregoing processes, and the like. The amount of time necessary to dry the article depends upon several factors and, in particular, the solvent of the suspension. For example, the metal containing TBC coated article may be dried at a temperature of about 750° F. to about 1600° F. for about 10 minutes to about 90 minutes in order to burn off the resin materials.

Suitable solvents for use in the suspension include, but are not limited to, water, alcohols, combinations comprising at least one of the foregoing solvents, and the like. Suitable dispersants may comprise organic dispersants which may evaporate and/or burn off easily during the drying step. Representative organic dispersants include, but are not limited to, polymethylmethacrylate (also known as "pmma"), polyvinyl alcohol, and the like. The aforementioned 'at least one dispersant' may be present in an amount of about 0.25% to about 3% by volume of the suspension. Suitable metals for use in the process of the present invention include, but are not limited to, lanthanum, cerium, praseodymium, neodymium, promethium, samarium, europium, gadolinium, terbium, dysprosium, holmium, erbium, thulium, ytterbium, lutelium, indium, scandium and yttrium. Such suitable metals may originally be present in the suspension in the form of an oxide of the same metals. The metal oxides may disassociate to form the aforementioned metal as a metal particulate. The metal particulate may comprise a diameter of about 10 nanometers to about 1000 nanometers and may be present in an amount of about 25 percent to about 50 percent by volume of the suspension. The size of the metal particulate allows the metal to penetrate the TBC and settle within the interstices and tortuous, interconnected porosity.

Referring again to FIG. 1, after drying the article, boxes (16), (18) and (20) may be repeated as often as necessary at a box 22 in order to achieve the desired metal containing TBC properties. The desired metal containing TBC properties of the coated article may be characterized as at least a desired loading of metal within the interstices or tortuous, interconnected porosity of the TBC, including the desired porosity of the metal containing TBC. The desired loading of the metal within the TBC may be about 25% to about 100% by weight of the TBC, and preferably about 60% to about 70% by weight of the TBC. The desired porosity of the metal containing TBC may be no more than about 30%, and preferably no more than about 20%.

The ultra-violet curable resin may comprise a resin, at least one of each of the following: photoinitiator, additive, modifier, monomer, and oligomer. The resin may comprise a urethane based resin that may require one or more curing steps, for example, a dual curing resin. The at least one photoinitiator may comprise a substance that initiates polymerization of the resin when exposed to ultra-violet light energy of a compatible wavelength. For a dual curing resin, two initiators may be required such that the second initiator may require heat in order to facilitate polymerization of the resin. Dual cure resins are effective when curing coatings where the ultra-violet light energy may not reach the resin material, such as in between the columnar or microcolumnar structures of the coating or at a certain depth in the coating as known to one of ordinary skill in the art. The at least one additive may comprise a filler chemical capable of enhancing one or more resin properties such as, but not limited to, flow rate, wetting, color, fluorescence and achieving tack-free surfaces. The at least one modifier may comprise a substance capable of increasing the durability, for example, impact resistance, crack resistance and the like, of the resin. The at least one monomer may comprise at least one single unit of a polymer capable of providing and/or enhancing adhesion to surface materials, for example, the adhesion of the resin to the surface of the article being coated. The at least one oligomer is recognized as the backbone of the resin and may comprise a polymer unit of about 6 monomer units to about 40 monomer units that imparts the basic properties of the ultra-violet curable resin such as, but not limited to, hardness, elongation, chemical resistance, and the like. In the alternative, the ultra-violet curable resin may be substituted with at least one heat curable resin as known to one of ordinary skill in the art.

Figure 2:
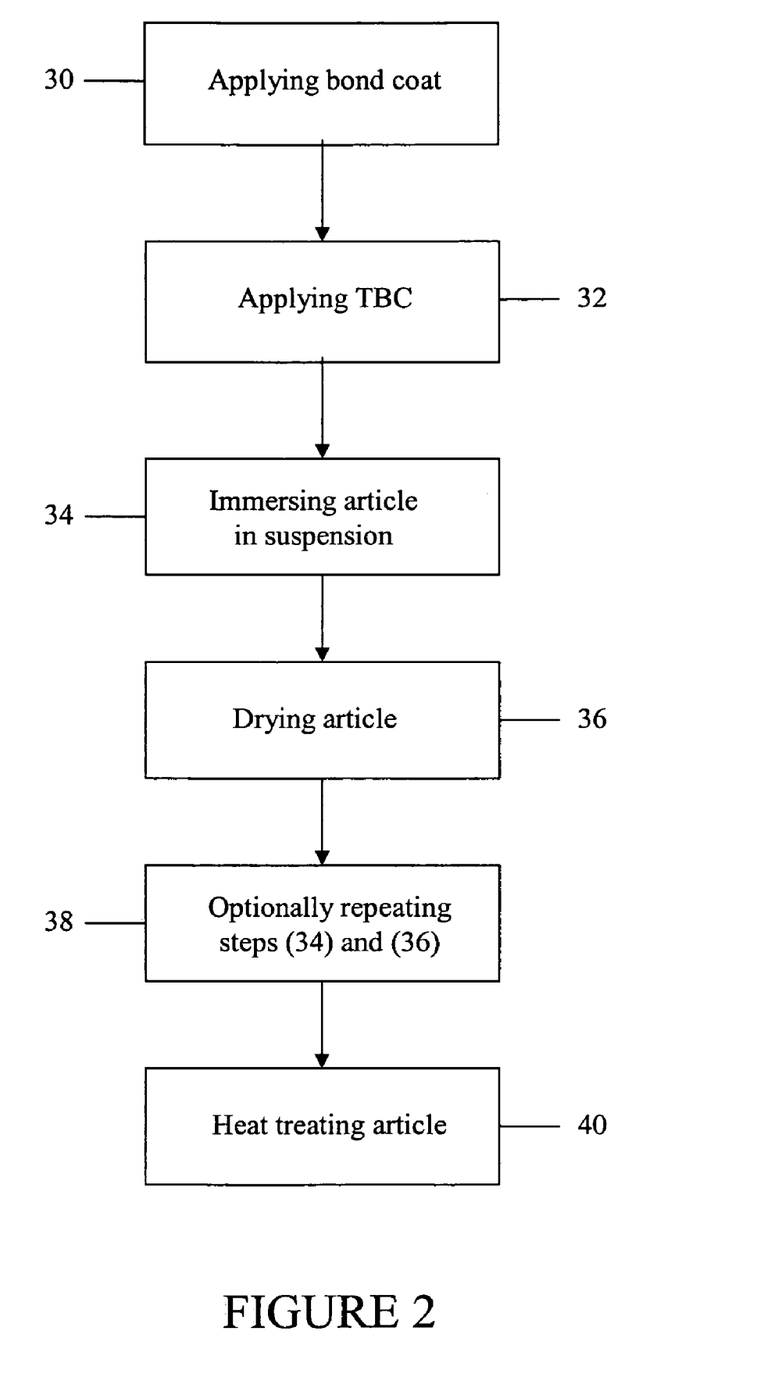

Referring now to FIG. 2, a flowchart representing another process of the present invention is shown. Any of the aforementioned articles may be provided and may be coated with optionally one or more of the aforementioned bond coat materials, and one or more of the aforementioned thermal barrier compounds previously discussed as indicated at boxes 30 and 32 of FIG. 2. The thermal barrier coating may be applied using any of the aforementioned suitable application processes described herein.

At a box 34 of FIG. 2, the article may be immersed within a solution comprising a suspension containing at least a metal particulate originally present as an oxide of a metal, where the metal may be applied to the TBC using an electrophoretic deposition process as known to one of ordinary skill in the art. In addition to the metal particulate, the suspension may also comprise at least one solvent, at least one pH stabilizer, optionally a dispersant and optionally a binder.

The metal particulate concentration of the suspension may be about 0.001 weight percent solids to about 5 weight percent solids by weight of the suspension, and preferably about 0.005 weight percent solids to about 0.05 weight percent solids by weight of the suspension. The metal particulate may possess a diameter of about 0.02 microns to about 0.2 microns, and preferably about 0.05 microns.

Throughout the electrophoretic deposition process, the suspension may be maintained at a temperature of about 68° F. (20° C.) to about 120° F. (49° C.), while a temperature of about 68° F., e.g., room temperature, is preferred. When immersing the article into the suspension, the suspension may have a pH maintained at a value below the isoelectric point of the metal particulate. The isoelectric point of the metal particulate may be measured using any number of processes known to one of ordinary skill in the art. The pH value of the suspension may be maintained at pH range of about 2 to about 7, while a pH range of about 3 to about 4.5 is preferred.

Suitable solvents for use herein may include, but are not limited to, water, alcohols (e.g., methanol, ethanol and the like), trichloroethane, mixtures thereof, and the like. The pH level of the suspension may be maintained by the addition of at least one acid. Suitable acids for use herein may include, but are not limited to, nitric acid, hydrochloric acid, acetic acid, stearic acid, mixtures thereof, and the like. Suitable dispersants for use herein to prevent agglomeration and settling of the metal particulate may include, but are not limited to, pmma, ammonium stearate, and the like. Suitable binders may include, but are not limited to, polyvinyl alcohol and the like.

The metal particulate may be biased with a positive DC charge within the suspension. At the same time, the article may be biased with a negative DC charge to accelerate the suspended metal particulate towards the surface of the TBC. The metal particulate may then infiltrate the TBC, for example, penetrate the interstices and tortuous, interconnected porosity of the TBC coating microstructures. Typical negative biasing voltages may range from about 50 Volts to about 2000 Volts. Although higher voltages may lead to higher deposition rates, higher voltages may also lead to hazards and raise workplace safety issues.

At a box 36 of FIG. 2, the metal containing TBC coated article may be dried at a temperature of about 68° F. for about 1 hour to about 20 hours, and preferably about 3 hours to about 10 hours. The amount of time may be reduced to about 0.5 hours to about 5 hours, and preferably about 1 hour to about 2 hours, by raising the temperature up to about 250° F. After drying the article, boxes (34) and (36) may be repeated as often as necessary at a box 38 in order to achieve the desired metal containing TBC properties.

At a box 40 of FIG. 2, the metal containing TBC coated article may also be heat treated, e.g., sintered, at a temperature of about 1950° F. to about 2000° F. for about 3 hours to about 4 hours, and preferably at a temperature of about 1975° F. for about 4 hours. The desired metal containing TBC properties of the coated article may be characterized as at least a desired loading of metal within the interstices or tortuous, interconnected porosity of the TBC, including the desired porosity of the metal containing TBC. The desired loading of the metal within the TBC may be about 25% to about 100% by weight of the TBC, and preferably about 60% to about 70% by weight of the TBC. The desired porosity of the metal containing TBC may be no more than about 30%, and preferably no more than about 20%.

Figure 3:
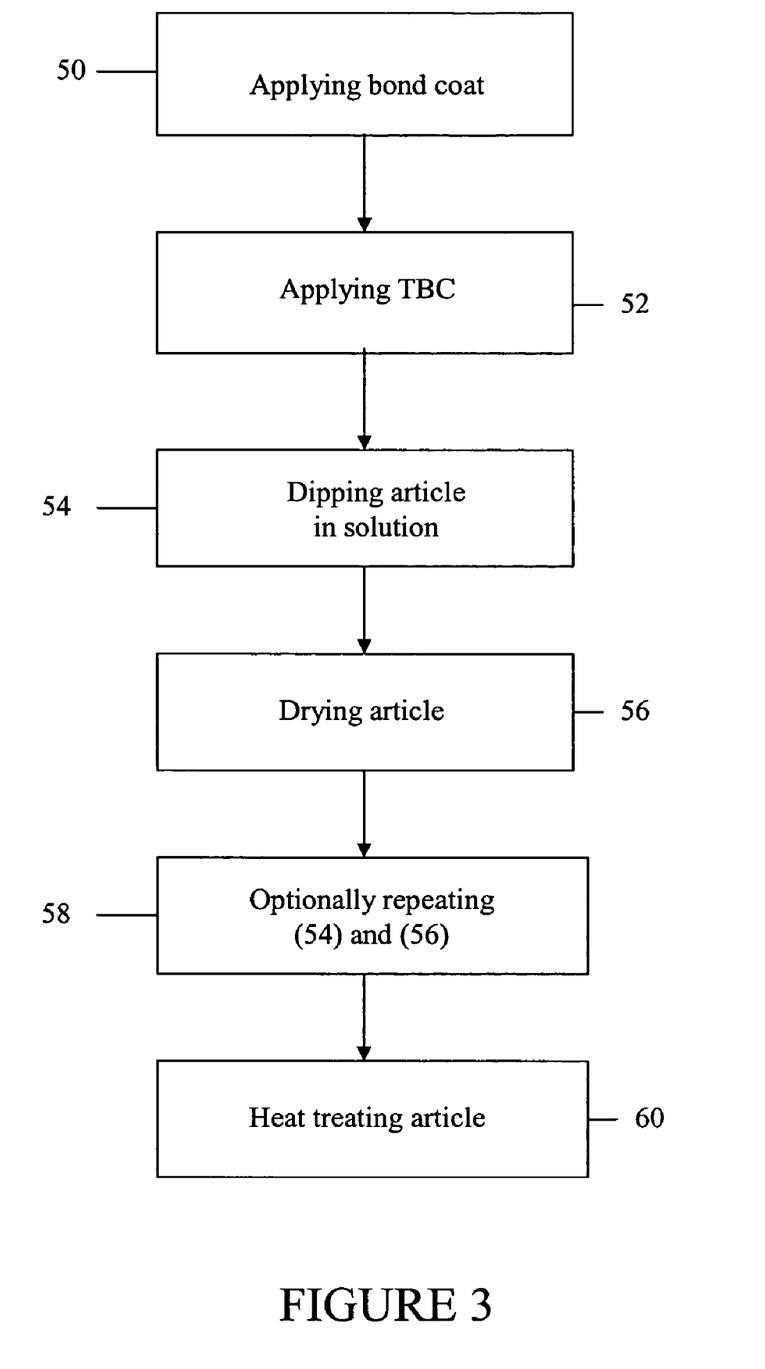
FIG. 3 is a flowchart representing another process of the present invention.

Referring now to FIG. 3, a flowchart representing another process of the present invention is shown. Again, any one of the aforementioned articles may be provided and may be coated with optionally one or more of the aforementioned bond coat materials, and one or more of the aforementioned thermal barrier compounds previously discussed as indicated at a box 50 and a box 52 of FIG. 3. The thermal barrier coating may be applied using any of the aforementioned suitable application processes described herein.

Once the TBC is applied, the article may be immersed within an aqueous solution as indicated at a box 54 of FIG. 3. The aqueous solution may comprise a solvent and a metal originally present as a salt of a metal. The article may be dipped or immersed within the aqueous salt solution at room temperature and vacuum impregnated with the metal contained in the aqueous salt solution. When vacuum impregnating a TBC comprising a columnar structure having interstices, the article may be dipped or immersed initially at a temperature of about 68° F. (20° C.) to about 150° F. (66° C.) under a vacuum of about 10 torr (0.19 psi) to about 100 torr (1.9 psi) for about 2 minutes to about 5 minutes at which point the pressure may then be adjusted to atmospheric pressure, that is, about 760 torr (14.7 psi). A higher temperature within the range of about 68° F. to about 150° F. would be utilized if the solution exhibited a viscosity capable of impeding the infiltration of the metal within the TBC. When the TBC comprises a tortuous, interconnected porosity, the article may be dipped or immersed within the suspension at room temperature and initially under a vacuum of about 10 torr (0.19 psi) to about 100 torr (1.9 psi) for about 2 to about 10 minutes at which point the pressure may then be adjusted to atmospheric pressure. Again, vacuum impregnation as well as agitating the article within the aqueous solution is utilized to draw out the air present in the interstices or porosity of the TBC in order to make room for the metal to enter.

Suitable solvents for use in the aqueous solution include, but are not limited to, water, combinations comprising at least water, and the like. Suitable metals for use in the process of the present invention include, but are not limited to, lanthanum, cerium, praseodymium, neodymium, promethium, samarium, europium, gadolinium, terbium, dysprosium, holmium, erbium, thulium, ytterbium, lutelium, indium, scandium and yttrium. Such suitable metals may originally be present in the aqueous solution in the form of a salt of the same metals, for example, gadolinium acetate, gadolinium nitrate, zirconium acetate, zirconium nitrate, and the like. The metal salts disassociate to form the aforementioned metal as a metal particulate. The metal particulate may comprise a diameter of about 10 nanometers to about 1000 nanometers and may be present in an amount of about 25 percent to about 50 percent by volume of the aqueous solution. The size of the metal particulate allows the metal to penetrate the TBC and settle within the interstices and tortuous, interconnected porosity.

After dipping or immersing the TBC coated article, the dipped article may be dried at a temperature of about 300° F. for an amount of time necessary to remove, that is, evaporate or burn off, the solvent at a box 56 of FIG. 3. After removing the solvent, boxes (54) and (56) may be repeated as often as necessary at a box 58 in order to achieve the desired metal containing TBC properties. The article may then be heat treated at a temperature of about 300° F. (149° C.) to about 750° F. (399° C.) at a box 60 of FIG. 3 to remove excess reagents present from the aqueous solution, for example, acetates, nitrates, and the like. The desired metal containing TBC properties of the coated article may be characterized as at least a desired loading of metal within the interstices or tortuous, interconnected porosity of the TBC, including the desired porosity of the metal containing TBC. The desired loading of the metal within the TBC may be about 25% to about 100% by weight of the TBC, and preferably about 60% to about 70% by weight of the TBC. The desired porosity of the metal containing TBC may be no more than about 30% by volume of the TBC, and preferably no more than about 20% by volume of the TBC.

Figure 4:
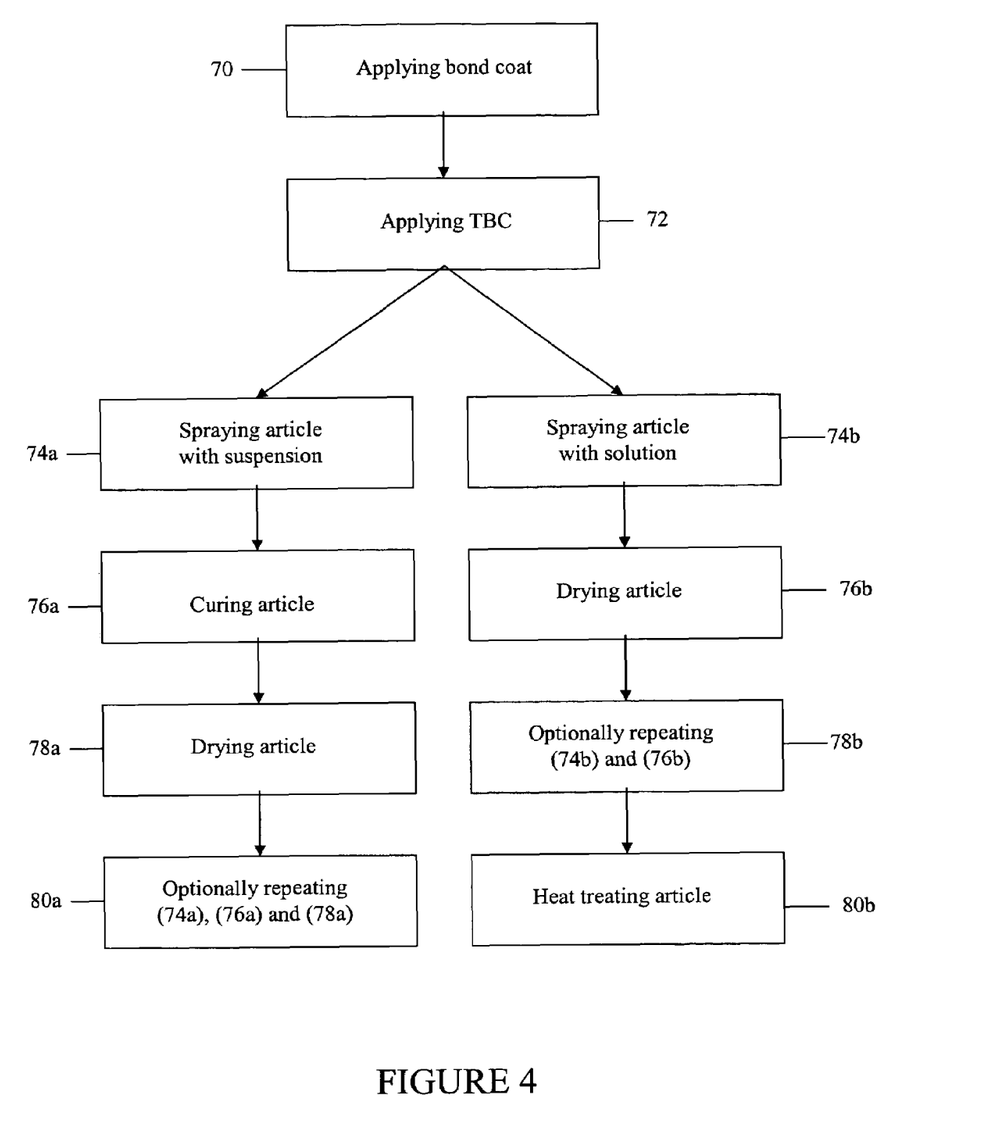
FIG. 4 is a flowchart representing another process of the present invention.

Referring now to FIG. 4, a flowchart representing another process of the present invention is shown. An article is provided and may be coated with an optional bond coat material layer and a thermal barrier compound at a box 70 and a box 72 of FIG. 4. Again, any of the aforementioned articles may be provided and may be coated with one or more of the aforementioned optional bond coat materials and thermal barrier compounds previously discussed. The optional bond coat and thermal barrier coating may be applied using any of the aforementioned suitable application processes described herein.

Once the TBC is applied, the TBC coated article may be sprayed with (a) the aforementioned suspension comprising the solvent, the metal originally present as an oxide of the metal, and the at least one ultra-violet curable resin, at least one dispersant and in the alternative, or in addition to, at least one surfactant as previously described, or (b) the aforementioned aqueous solution comprising the solvent and the metal originally present as a salt of the metal as previously described. At boxes 74a and 74b, the aforementioned suspension and aforementioned aqueous solution may each be sprayed upon at least the TBC of the TBC coated article using any processes known to one of ordinary skill in the art suitable for use herein. Suitable spraying processes include, but are not limited to, air pressure spraying, airless spraying, thermal spraying processes, air plasma spraying processes, high velocity oxygen fuel spraying processes, combinations comprising at least one of the foregoing spraying processes, and the like.

After spraying the TBC coated article, the metal containing TBC coated article may be treated with ultra-violet light energy to cure the ultra-violet curable resin present in the metal containing TBC as previously described herein. After curing the TBC coated article at a box 76a, the metal containing coated article may be dried to remove any excess reagents remaining in the TBC. For example, at boxes 78a and 76b, the metal containing coated article may be dried under a vacuum of about 10 torr to about 100 torr at a temperature of about 68° F. (20° C.) to about 150° F. (66° C.) for an amount of time sufficient to dry the coating.

When utilizing the aforementioned suspension, boxes (74a), (76a) and (78a) may be repeated as often as necessary at a box 80a in order to achieve the aforementioned desired metal containing properties as described above. When utilizing the aforementioned aqueous solution, boxes (74b) and (76b) may be repeated as often as necessary at a box 80b in order to achieve the aforementioned desired metal containing properties as described above.

As described earlier, the use of an aqueous solution comprising a metal salt requires an additional step to remove the excess reagents from the metal containing TBC coated article. At a box 80b of FIG. 4, the article may be heat treated at a temperature of about 300° F. to about 750° F. to remove excess reagents present from the aqueous solution, for example, acetates, nitrates, and the like.

In forming coated articles using the processes shown in FIG. 4, the resultant metal containing TBC coated article may comprise a desired loading of metal within the TBC of about 25% to about 100% by weight of the TBC, and preferably about 60% to about 70% by weight of the TBC, and in addition, or in the alternative, a desired porosity of no more than about 30% by volume of the TBC, and preferably no more than about 20% by volume of the TBC.

Figure 5:
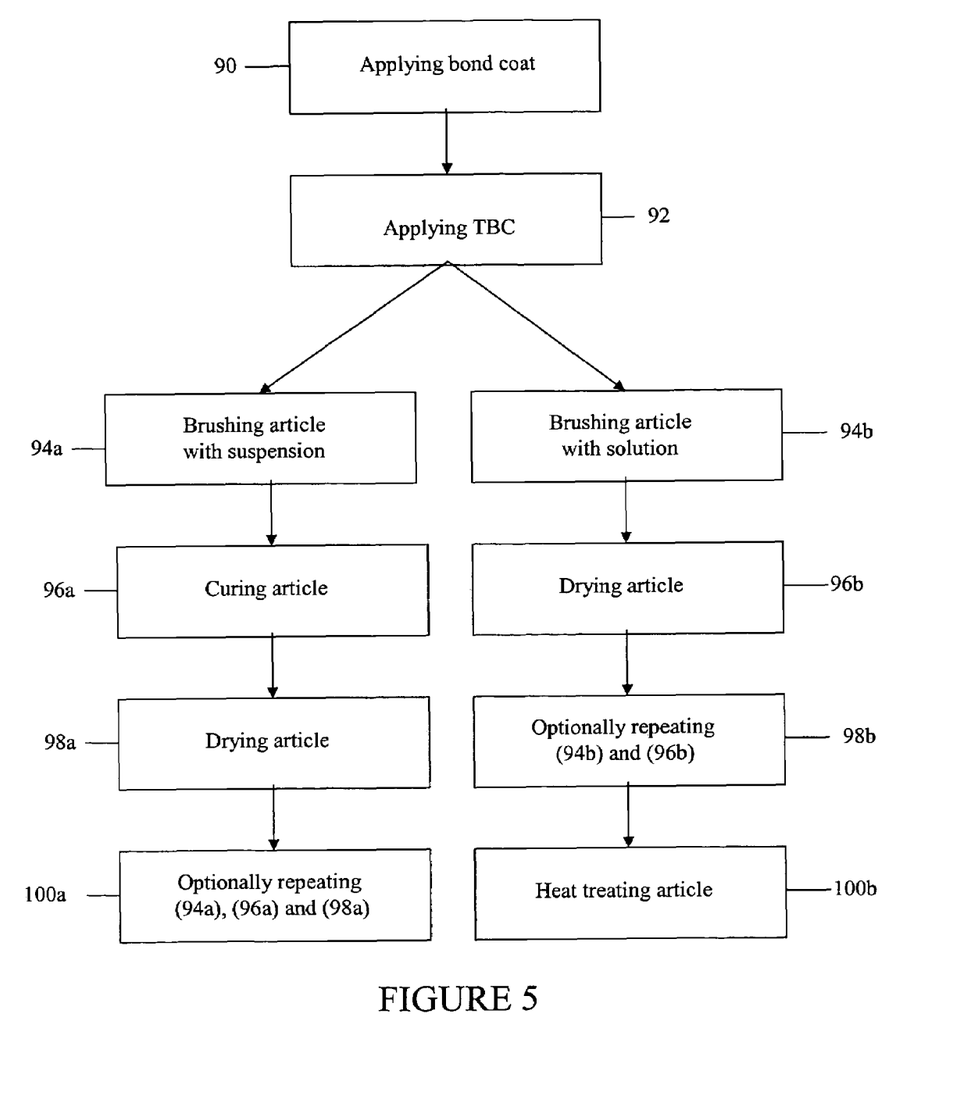
FIG. 5 is a flowchart representing another process of the present invention.

Referring now to FIG. 5, a flowchart representing yet another process of the present invention is shown. An article is provided and may be coated with an optional bond coat material and a thermal barrier compound to form a TBC at a box 90 and a box 92. Again, any of the aforementioned articles may be provided and may be coated with one or more of the aforementioned optional bond coat materials and thermal barrier compounds previously described. The optional bond coat and thermal barrier coating may be applied using any of the aforementioned suitable application processes described herein.

Once the TBC is applied, the TBC coated article may be brushed, or painted, with (a) the aforementioned suspension comprising the solvent, the metal originally present as an oxide of the metal, and the at least one ultra-violet curable resin, at least one dispersant and in the alternative, or in addition to, at least one surfactant as previously described, or (b) the aforementioned aqueous solution comprising the solvent and the metal originally present as a salt of the metal as previously described. At boxes 94a and 94b, the aforementioned suspension and aforementioned aqueous solution may each be brushed or painted upon at least the TBC of the TBC coated article using any brushing or painting processes known to one of ordinary skill in the art suitable for use herein.

After brushing or painting the TBC coated article at box 94a, the metal containing TBC coated article may be treated with ultra-violet light energy at a box 96a to cure the ultra-violet curable resin present in the metal containing TBC as previously described herein. After curing the metal containing TBC coated article in Step 4a, the metal containing coated article may be dried to remove any excess reagents remaining in the TBC.

At a box 98a of FIG. 5, the article may be dried using any of the suitable processes as previously described herein. At a box 96b of FIG. 5, the article may be dried to remove excess solvent using any of the suitable processes as previously described herein.

When utilizing the aforementioned suspension, steps (94a), (96a) and (98a) may be repeated as often as necessary at a box 100a of FIG. 5 in order to achieve the aforementioned desired metal containing properties as described above. When utilizing the aforementioned aqueous solution, boxes (94b) and (96b) may be repeated as often as necessary at a box 98b of FIG. 5 in order to achieve the aforementioned desired metal containing properties as described above.

As described earlier, the use of an aqueous solution comprising a metal salt requires an additional step to remove excess reagents from the metal containing TBC coated article. In step 100b of FIG. 5, the article may be heat treated at a temperature of about 300° F. to about 750° F. to remove excess reagents present from the aqueous solution, for example, acetates, nitrates, and the like.

In forming coated articles using the processes shown in FIG. 5, the resultant metal containing TBC coated article may comprise a desired loading of metal within the TBC of about 25% to about 100% by weight of the TBC, and preferably about 60% to about 70% by weight of the TBC, and in addition, or in the alternative, a desired porosity of no more than about 30% by volume of the TBC, and preferably no more than about 20% by volume of the TBC.

The resultant product in all of the processes of the present invention may be a metal or metal oxide containing TBC coated article. As described earlier, the article may comprise a part used in turbomachinery applications such as, but not limited to, any part having an airfoil, any part having a seal, airfoils, seals, and the like. As known to one of ordinary skill in the art, TBC coatings for turbomachinery parts having seals, or seals in general, are typically thicker than TBC coatings for turbomachinery parts having an airfoil, or airfoils in general. Likewise, the metal containing TBC coatings of the coated articles of the present invention adhere to these industry standards known to one of ordinary skill in the art.

For example, the article may include, but is not limited to blades, vanes, stators and mid-turbine frame. And, in yet another example, the article may include, but is not limited to, seals, combustor panels, combustor chambers, combustor bulkhead panels, disk side plates and fuel nozzle guides.

Generally, the metal containing TBC coatings of coated articles having an airfoil, or a coated airfoil in general, of the present invention are about 5 mils to about 15 mils thick. And, generally, the metal containing TBC coatings of coated articles having a seal, or a coated seal in general, of the present invention are about 0.5 mils to about 50 mils thick. These ranges of TBC coating thicknesses for such coated articles may be broadened or narrowed depending upon the particular application of the article as will be recognized and understood in the future by one of ordinary skill in the art.

Figure 6:
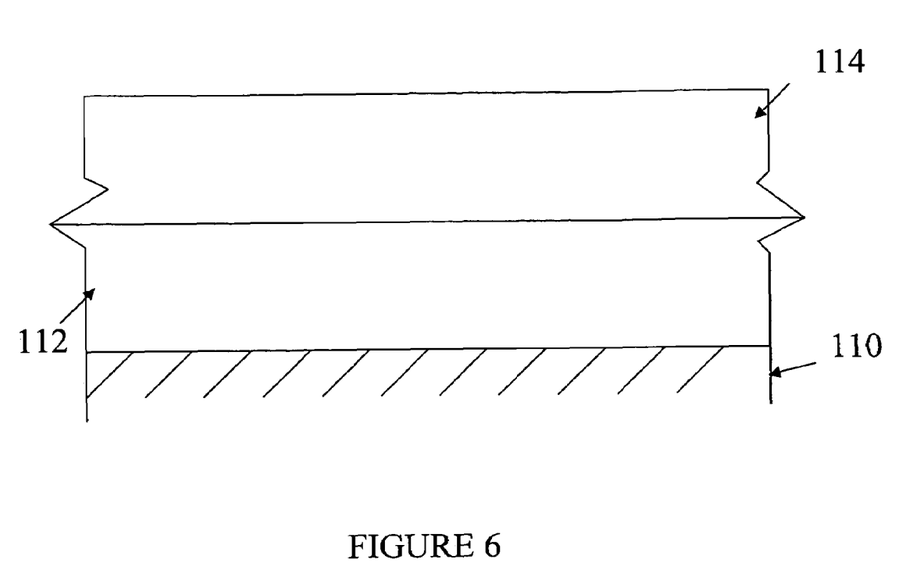
FIG. 6 is a representation of an article coated with a bond coat and at least one layer of a metal containing thermal barrier coating of the present invention.
Figure 7:
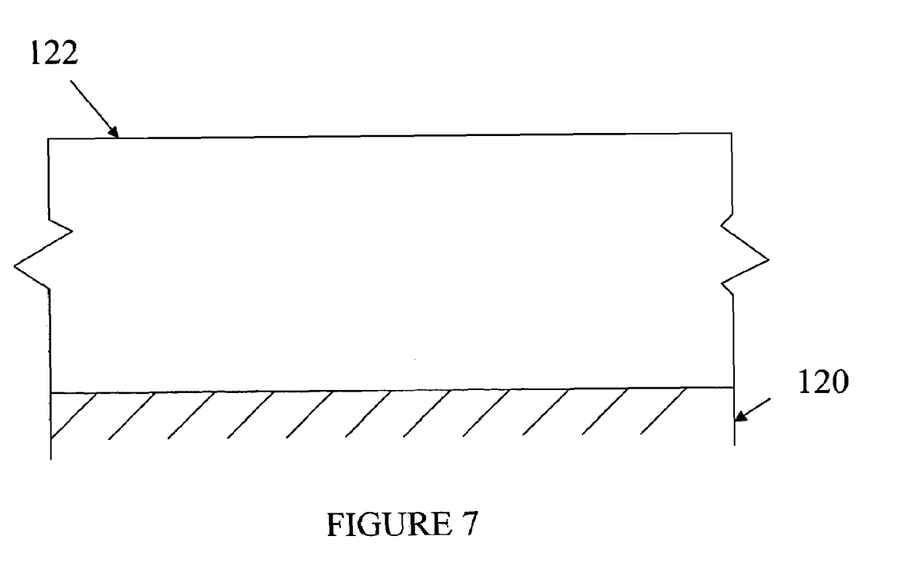
FIG. 7 is a representation of an article coated with at least one layer of a metal containing thermal barrier coating of the present invention.

Referring now to FIGS. 6 and 7, the resultant product in all of the processes of the present invention may be an article 110 coated with an optional bond coat layer 112 and at least one layer of a metal containing TBC 114 (See FIG. 6), or an article 120 coated with the at least one layer of the metal containing TBC 122 (See FIG. 7). As described earlier, the article may comprise a part used in turbomachinery applications such as, but not limited to, any part having an airfoil, any part having a seal, airfoils, seals, and the like. As known to one of ordinary skill in the art, TBC coatings for turbomachinery parts having seals, or seals in general, are typically thicker than TBC coatings for turbomachinery parts having an airfoil, or airfoils in general. Likewise, the coated articles of the present invention adhere to these industry standards known to one of ordinary skill in the art.

The metal containing TBC coating of the present invention may comprise at least the ceramic based compound, the metal comprising a particulate having a diameter of about 10 nanometers to about 1000 nanometers and present in an amount of at least about 25% by weight of the coating, and the oxide of the metal. The metal may be dispersed throughout the entirety of the coating, and preferably dispersed from the surface of the article to the surface of the TBC. The metal particulate is preferably dispersed within the interstices of the columnar structures of the TBC or the tortuous, interconnected pores of the TBC. As a result, the metal containing TBC coating may comprise further a porosity of no more than about 30% by volume of the TBC, and preferably no more than about 20% by volume of the TBC.

The metal containing TBC coating of the present invention may generally comprise the metal in an amount of about 25% by weight to about 100% by weight of the TBC coating, and preferably about 60% by weight to about 70% by weight of the TBC coating, with remainder comprising the ceramic based compound and the metal oxide.

The ceramic based compound of the TBC of the present invention may comprise any stabilized zirconate or stabilized hafnate, for example, yttria stabilized zirconia, calcia stabilized zirconia, magnesia stabilized zirconia, yttria stabilized hafnia, calcia stabilized hafnia and magnesia stabilized hafnia. The metal oxide may comprise an oxide of a metal such as, but not limited to, lanthanum, cerium, praseodymium, neodymium, promethium, samarium, europium, gadolinium, terbium, dysprosium, holmium, erbium, thulium, ytterbium, lutelium, indium, scandium, yttrium, combinations comprising at least one of the foregoing metals, and the like. The metal salt may comprise a salt of a metal such as, but not limited to lanthanum, cerium, praseodymium, neodymium, promethium, samarium, europium, gadolinium, terbium, dysprosium, holmium, erbium, thulium, ytterbium, lutelium, indium, scandium, yttrium, combinations comprising at least one of the foregoing metals, and the like.

The metal oxide of the TBC of the present invention is formed as a result of carrying out the processes of the present invention in an oxidizing environment. As known to one of ordinary skill in the art, TBC coatings typically include metal oxides to promote their chemical stability and enhance their durability. The metal oxide may comprise a simple metal oxide, a binary metal oxide, a tertiary metal oxide, a poly metal oxide (quaternary, etc.), and the like. Binary, tertiary and poly metal oxides may form due to the presence of more than one metal initially being present, for example, more than one metal salt or metal oxide, or may form as a reaction product of the metal present in the ceramic based compound and the metal oxide or metal salt during the processes of the present invention. Likewise, the single metal oxide may be present as the original metal oxide, the oxide of the original metal salt, the oxide of a metal of the ceramic based compound, and the like.

The thermal barrier coating of the present invention is designed to react with at least one component of molten sand, for example, calcium magnesia alumina silicate (hereinafter referred to as "CMAS"), and form a sealant layer on or within the TBC. As a result, a thermal barrier coating of the present invention during its use may comprise at least a reaction product of CMAS and the components of the metal containing TBC composition of the present invention.

The components of the metal containing TBC composition may be the aforementioned metal, metal oxide and ceramic based compound described herein including the amounts disclosed. The reaction product of the CMAS and metal of the TBC of the present invention may comprise further at least one reaction product as more than one reaction product may form during the useful life of the metal containing TBC of the present invention. For example, a metal containing TBC comprising gadolinium, gadolinium oxide and 7YSZ may react with CMAS to form a reaction product comprising at least silicate oxyapatite comprising at least gadolinia, calcia, zirconia and silica.

The reaction product or products form throughout the entirety of the metal containing TBC of the present invention as the metal is dispersed throughout the entirety of the TBC and the molten sand penetrates through to the coated article's surface. The at least one reaction product forms a sealant composition or layer throughout the metal containing TBC. The resultant sealant composition remains present as the metal containing TBC experiences typical wear and tear, for example, abrasion, erosion, spallation, etc., consistent with general use. Thus, as the metal containing TBC wears during its useful life, the sealant layer reforms, remains intact and effectively takes the place of the metal containing TBC. The resultant sealant layer may also exhibit the desired porosity of no more than about 30% by volume of the TBC, and preferably no more than about 20% by volume of the TBC.

One or more embodiments of the present invention have been described. Nevertheless, it will be understood that various modifications may be made without departing from the spirit and scope of the invention. Accordingly, other embodiments are within the scope of the following claims.

What is claimed is:

1. A thermal barrier coating, comprising:
    a ceramic based compound selected from the group consisting of yttria stabilized zirconia, calcia stabilized zirconia, magnesia stabilized zirconia, yttria stabilized hafnia, calcia stabilized hafnia and magnesia stabilized hafnia;
    a metal oxide; and
    a metal comprising a diameter of about 10 nanometers to about 1000 nanometers and present in an amount of at least about 25 percent by weight of said ceramic based compound,
    wherein the thermal barrier coating comprises a porosity of no more than 20 percent by volume of said ceramic based compound.

2. The thermal barrier coating of claim 1, wherein said metal oxide is an oxide of at least one metal selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof.

3. The thermal barrier coating of claim 1, wherein said metal is originally present in the form of a salt of at least one metal selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof.

4. The thermal barrier coating of claim 1, wherein said metal is selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof.

5. A coated article, comprising:
    an article comprising at least one surface having a thermal barrier coating disposed thereupon,
    wherein said thermal barrier coating comprises:
    a ceramic based compound selected from the group consisting of yttria stabilized zirconia, calcia stabilized zirconia, magnesia stabilized zirconia, yttria stabilized hafnia, calcia stabilized hafnia and magnesia stabilized hafnia;
    a metal oxide; and
    a metal in an amount of at least about 25 percent by weight of said ceramic based compound,
    wherein the thermal barrier coating comprises a porosity of no more than 20 percent by volume of said thermal barrier coating.

6. The coated article of claim 5, further comprising a bond coat layer disposed between said at least one surface and said thermal barrier coating.

7. The coated article of claim 6, wherein said bond coat layer comprises a bond coat material comprising a formula MCrAlY, wherein said M is a metal selected from the group consisting of nickel, cobalt, iron and mixtures thereof.

8. The coated article of claim 6, wherein said bond coat layer comprises a bond coat material selected from the group consisting of aluminum, platinum, and mixtures thereof.

9. The coated article of claim 6, wherein said bond coat layer comprises a bond coat material selected from the group consisting of aluminum, platinum and MCrAlY, wherein said M of said MCrAlY is a metal selected from the group consisting of nickel, cobalt, and iron, and mixtures thereof.

10. The coated article of claim 5, wherein said metal oxide is an oxide of at least one metal selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof.

11. The coated article of claim 5, wherein said metal is selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof.

12. The coated article of claim 5, wherein said article is selected from the group consisting of blades, vanes, stators and mid-turbine frame.

13. The coated article of claim 12, wherein said thermal barrier coating comprises a thickness of about 5 mils to about 15 mils.

14. The coated article of claim 5, wherein said article is selected from the group consisting of seals, combustor panels, combustor chambers, combustor bulkhead shields, disk side plates and fuel nozzle guides.

15. The coated article of claim 14, wherein said thermal barrier coating comprises a thickness of about 0.5 mils to about 50 mils.

16. A coating, comprising:
a reaction product of at least one silicate and a thermal barrier coating composition, wherein said thermal barrier coating composition comprises:
a ceramic based compound;
a metal oxide; and
a metal in an amount of at least about 25 percent by weight of said ceramic based compound,
wherein said reaction product comprises a porosity of no more than 20 percent by volume of the coating.

17. The coating of claim 16, wherein said at least one silicate comprises calcium magnesia alumina silicate.

18. The coating of claim 16, wherein said at least one silicate comprises iron calcium magnesia alumina silicate.

19. The coating of claim 16, wherein said ceramic based compound is selected from the group consisting of yttria stabilized zirconia, calcia stabilized zirconia, magnesia stabilized zirconia, yttria stabilized hafnia, calcia stabilized hafnia and magnesia stabilized hafnia.

20. The coating of claim 16, wherein said metal oxide is an oxide of at least one metal selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof.

21. The coating of claim 16, wherein said metal is selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof.

22. The coating of claim 16, wherein said metal is originally present in the form of a salt of at least one metal selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof.

23. The coating of claim 16, wherein said metal is originally present in the form of an oxide of at least one metal selected from the group consisting of lanthanum, cerium, praseodymium, neodymium, promethium, samarium, europium, gadolinium, terbium, dysprosium, holmium, erbium, thulium, ytterbium, lutelium, indium, scandium, yttrium, zirconium, hafnium, titanium, and mixtures thereof.

* * * * *